United States Patent
Shih et al.

(10) Patent No.: US 9,298,085 B2
(45) Date of Patent: Mar. 29, 2016

(54) METHOD FOR REPAIRING A MASK

(71) Applicant: Taiwan Semiconductor Manufacturing Company, Ltd., Hsin-Chu (TW)

(72) Inventors: Hsun-Chuan Shih, Hsinchu County (TW); Yuan-Chih Chu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 215 days.

(21) Appl. No.: 14/052,420

(22) Filed: Oct. 11, 2013

(65) Prior Publication Data

US 2015/0104733 A1 Apr. 16, 2015

(51) Int. Cl.
*G03F 1/72* (2012.01)
(52) U.S. Cl.
CPC ..................................... *G03F 1/72* (2013.01)

(58) Field of Classification Search
CPC ..................................... G03F 1/72; G03F 1/74
USPC ........................................................ 430/5, 394
See application file for complete search history.

(56) References Cited

U.S. PATENT DOCUMENTS

2006/0093925 A1\* 5/2006 Cheng .............................. 430/5
2006/0199082 A1\* 9/2006 Flanigan et al. ................. 430/5

\* cited by examiner

*Primary Examiner* — Stephen Rosasco
(74) *Attorney, Agent, or Firm* — Haynes and Boone, LLP

(57) ABSTRACT

A method for repairing a mask is disclosed. A mask, having at least one defect need to be repaired, is received. The mask includes a transmissive mask or a reflective mask. A location and size of the defect is determined. A repair hard mask (RHM) is formed over the mask. Various configuration of the RHM are disclosed. A repairing process is performed, with the RHM over the mask, to repair the defect.

20 Claims, 9 Drawing Sheets

METHOD FOR REPAIRING A MASK

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. In one example associated with lithography patterning, a photomask (or mask) to be used in a lithography process has a circuit pattern defined thereon and is to be transferred to wafers. The pattern on the mask needs to be very accurate and small, which can be adversely effected by any mask defects in the advanced technology nodes. It is desired to provide a high-resolution mask repairing process

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
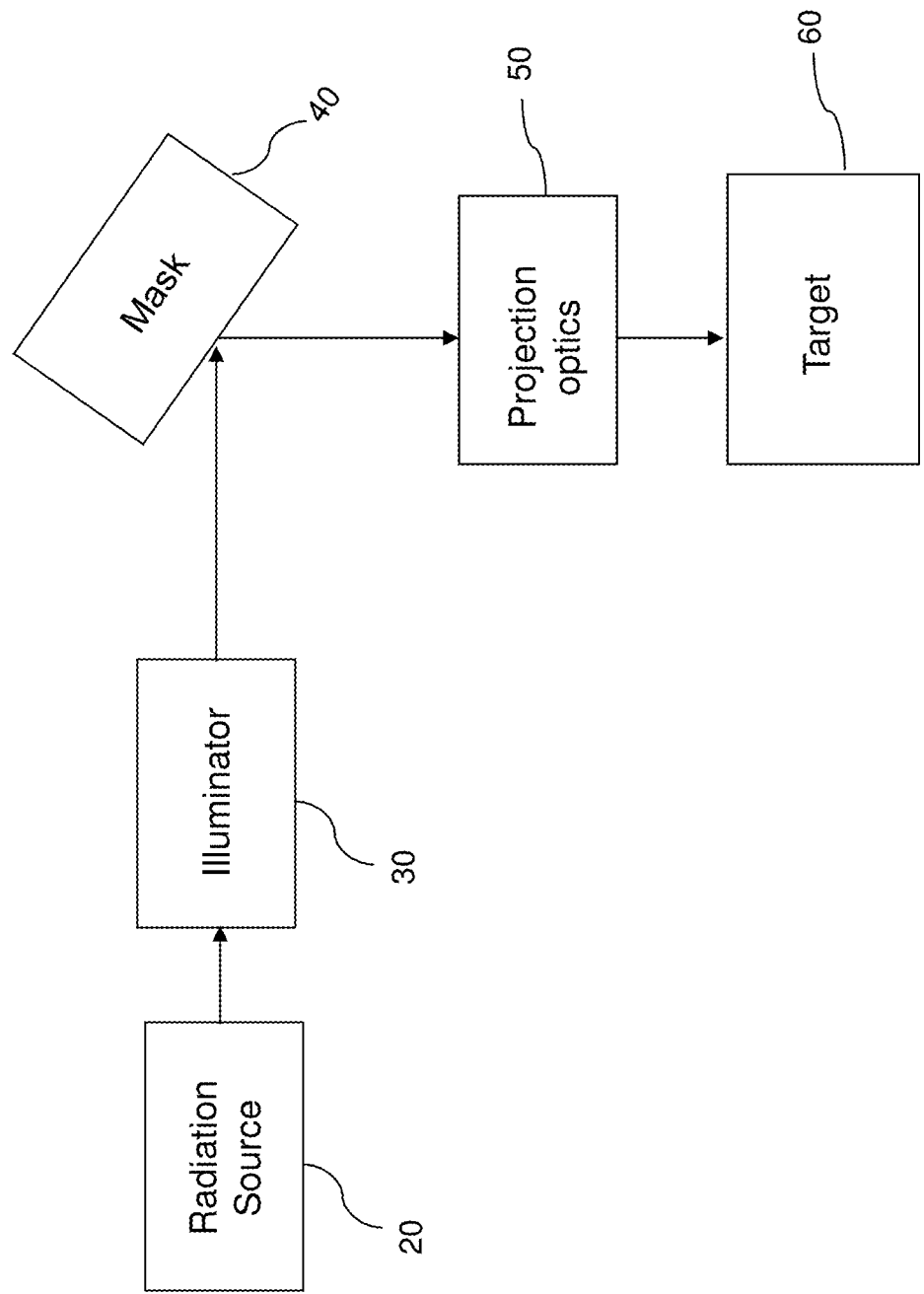
FIG. 1. is a block diagram of a lithography system for implementing one or more embodiments of the present invention.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "over" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Referring to FIG. 1, a lithography system 10 that may benefit from one or more embodiments of the present invention is disclosed. The lithography system 10 employs a radiation source 20. The radiation source 20 may be any suitable light source, such as a Krypton Fluoride (KrF) excimer laser with wavelength of 248 nm, an Argon Fluoride (ArF) excimer laser with a wavelength of 193 nm, a Fluoride (F2) excimer laser with a wavelength of 157 nm, or other light sources having a longer wavelength. The radiation source 20 may include an optical source selected from the group consisting of ultraviolet (UV) source, deep UV (DUV) source, extreme UV (EUV) source, and X-ray source. The radiation source may alternatively include a particle source selected from the group consisting of electron beam (E-Beam) source, ion beam source, and plasma source.

The lithography system 10 also employs an illuminator 30, which may comprise refractive optics such as a single lens or a lens system having multiple lenses, and reflective optics such as mirrors. For example, the illuminator 30 may include microlens arrays, shadow masks, and/or other structures designed to aid in directing light from the light source 20 towards the mask 40.

The lithography system 10 also employs a mask 40 (in the present disclosure, the terms of mask, photomask, and reticle are used to refer to the same item). The mask 40 can be a transmissive mask or a reflective mask. A transparent mask includes a transparent substrate and a patterned absorption (opaque) layer. A light beam may be partially or completely blocked when directed on an opaque region. The opaque layer may be patterned to have one or more openings through which an incident light may travel through (for a transparent mask) or reflect from a reflective region (for a reflective mask). A reflective mask includes an absorptive region and a reflective region. In the absorption region, a light beam may be partially or completely absorbed by an absorption layer, while in the reflective region, the absorption layer is removed and an incident light is reflected by a reflective multilayer (ML).

The lithography system 10 also employs a projection optics box (POB) 50. The POB 50 may have refractive optics or reflective optics. The radiation reflected from the mask 40 (e.g., a patterned radiation) is collected by the POB 50. The POB 50 may include a magnification of less than one (thereby reducing the patterned image included in the radiation).

The target 60 includes a semiconductor wafer with a photosensitive layer (e.g., photoresist or resist), which is sensitive to the EUV radiation. The target 60 may be held by a target substrate stage. The target substrate stage provides control of the target substrate position such that the image of the mask is scanned onto the target substrate in a repetitive fashion (though other lithography methods are possible).

The following description refers to the mask 40, mask fabrication and repairing processes. The mask fabrication may include two steps: a blank mask fabrication process, a mask patterning process. During the blank mask fabrication process, a blank mask is formed by depositing suitable layers (e.g., multiple reflective layers) on a suitable substrate. The blank mask is patterned during the mask patterning process to have a design pattern for a layer of an integrated circuit (IC) device (or chip). A mask repairing process may be implemented after the mask patterning process to mitigate the printability of defects on the patterned mask. After repairing, the patterned mask is then used to transfer the design pattern onto a semiconductor wafer. The design pattern can be transferred over and over onto multiple wafers through various lithography processes. Several masks (for example, a set of 15 to 30 masks) may be used to construct a complete IC device.

Figure 2:
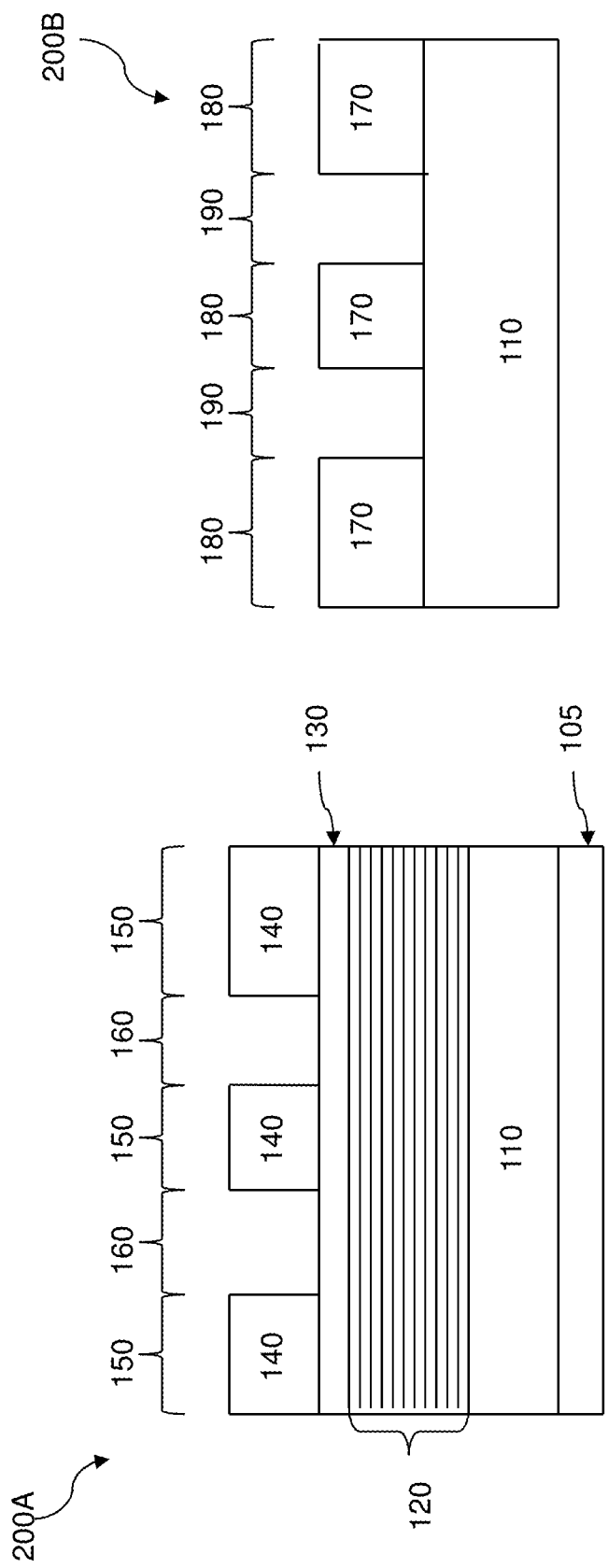
FIGS. 2A and 2B are cross sectional views of photomask (or reticle or mask) used in an lithography exposing tool that can benefit from one or more embodiments of the present disclosed method.

Referring to FIGS. 2A and 2B, a mask substrate includes a material layer 110. The material layer 110 may be made of low thermal expansion material (LTEM). As an example, the LTEM may include $TiO_2$, doped $SiO_2$, and/or other low thermal expansion materials known in the art. The LTEM layer 110 serves to minimize image distortion due to mask heating.

Now referring to FIG. 2A, for a reflective mask 200A, a reflective multilayer (ML) 120 is deposited over the LTEM layer 110. The ML 120 includes a plurality of film pairs, such as molybdenum-silicon (Mo/Si) film pairs (e.g., a layer of molybdenum above or below a layer of silicon in each film pair). Alternatively, the ML 120 may include molybdenum-beryllium (Mo/Be) film pairs, or any material that is highly reflective at EUV wavelengths can be utilized for the ML 120. A capping layer 130 is formed over the ML 120 to prevent oxidation of the ML. The capping layer 130 includes ruthenium (Ru), Ru compounds such as RuB, RuSi, chromium (Cr), Cr oxide, and Cr nitride. An absorption layer 140 is formed over the capping layer 130. The absorption layer 140 includes multiple film layers from a group consisting of tantalum (Ta), tantalum boron nitride (TaBN), tantalum, titanium, or aluminum-copper, palladium, tantalum nitride, aluminum oxide, molybdenum (Mo), or other suitable materials. In addition, a conductive layer 105 may be deposited under (as shown in the figure) the LTEM layer 110 for the electrostatic chucking purpose. In an embodiment, the conductive layer 105 includes chromium nitride (CrN), though other compositions are possible.

One or more of the layers 105, 120, 130 and 140 may be formed by various methods, including physical vapor deposition (PVD) process, a chemical vapor deposition (CVD) process, ion beam deposition, spin-on coating, metal-organic decomposition (MOD), and/or other methods known in the art.

The absorption layer 140 is patterned to form the design layout pattern EUV mask 200 by defining two regions, an absorptive region 150 and a reflective region 160. A patterning process may include resist coating (e.g., spin-on coating), soft baking, mask aligning, exposure, post-exposure baking, developing the resist, rinsing, drying (e.g., hard baking), other suitable processes, and/or combinations thereof. Alternatively, the photolithography exposing process is implemented or replaced by other proper methods such as maskless photolithography, electron-beam writing, direct-writing, and/or ion-beam writing. An etching process is performed next to remove portions of the absorption layer 140. The etching process may include dry (plasma) etching, wet etching, and/or other etching methods.

Now referring to FIG. 2B, for a transmissive mask 200B, a patterned absorption (an opaque) layer 170 is formed over the LTEM layer 110. The patterned absorption layer 170 defines two regions: an absorptive region 180 and a transmissive region 190. The patterned opaque layer 170 includes chromium, chromium oxide, aluminum-copper palladium, tantalum nitride, aluminum oxide titanium, tungsten, and/or combinations thereof. The patterned opaque layer 170 is formed similarly in many respects to the patterned absorption layer 140 discussed above in association with FIG. 2A.

Figure 3:
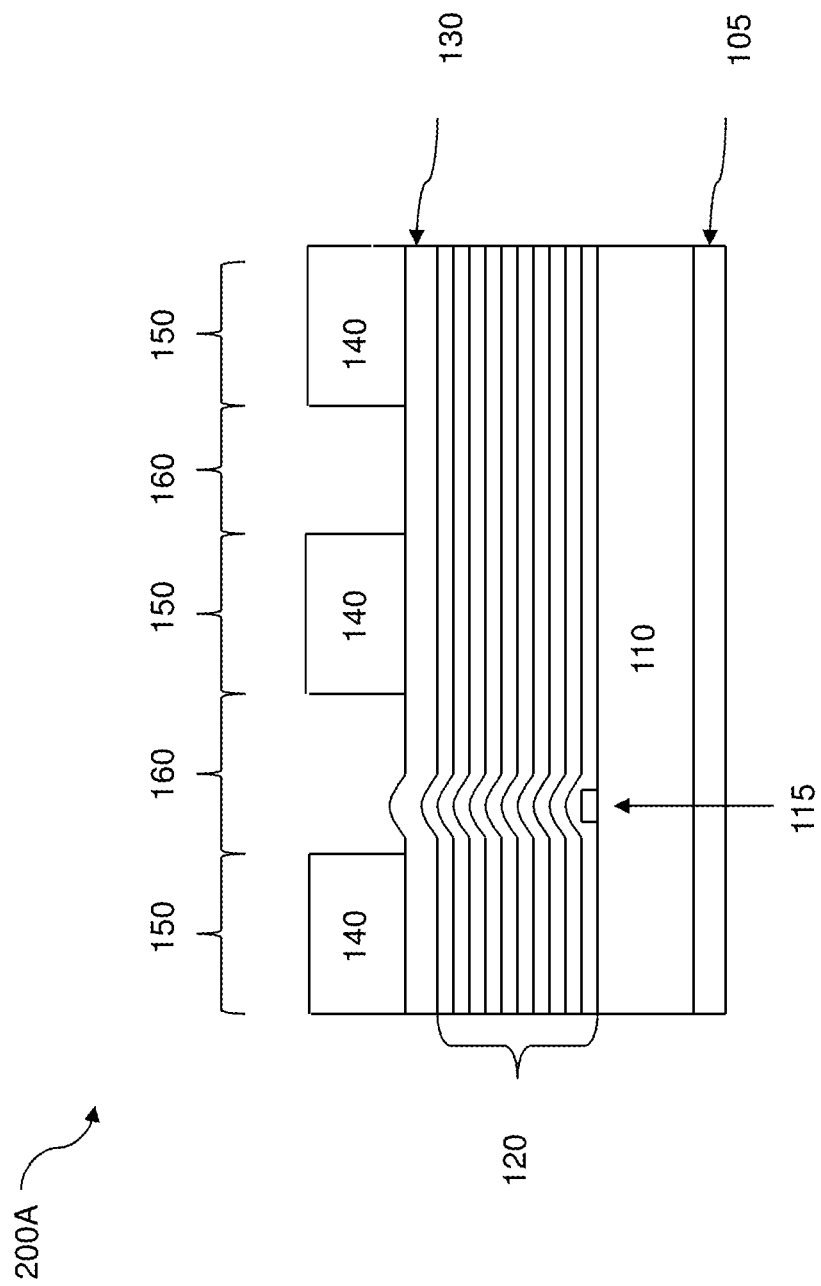
FIG. 3 is a cross sectional view of an exemplary defect in a reflective mask constructed according to various embodiments.

One challenge in lithography technique occurs when a defect appears in/on a mask. For example, referring to FIG. 3, a defect 115, such as a bump or a pit, on the surface of the LTEM substrate 110 (beneath the ML 120) or embedded in the ML 120 in the reflective region 160 of the refractive mask 200A. The defect 115 may form during fabricating the LTEM layer 110, the ML 120, or any other process. The defect 115 may cause local deformation of all subsequent layers above it. The defect 115 may change or distort a reflected illumination beam in direction, shape, or phase. Therefore, a quality or integrity of the corresponding exposed image is impacted by the defect located in the reflective region 160 of the reflective mask 200A. For another example, defects include a residue of the absorption layer left in the transmissive or the reflective region of a mask. For yet another example, defects include any undesired pattern features in a mask.

Thus a mask repairing process is performed to the mask. Sometimes a width of a repair region is resulted in an unwanted larger size, referred to as repair-region-width-broaden effect, in the mask repairing process. The present disclosure offers a high-resolution mask repairing process.

Figure 4:
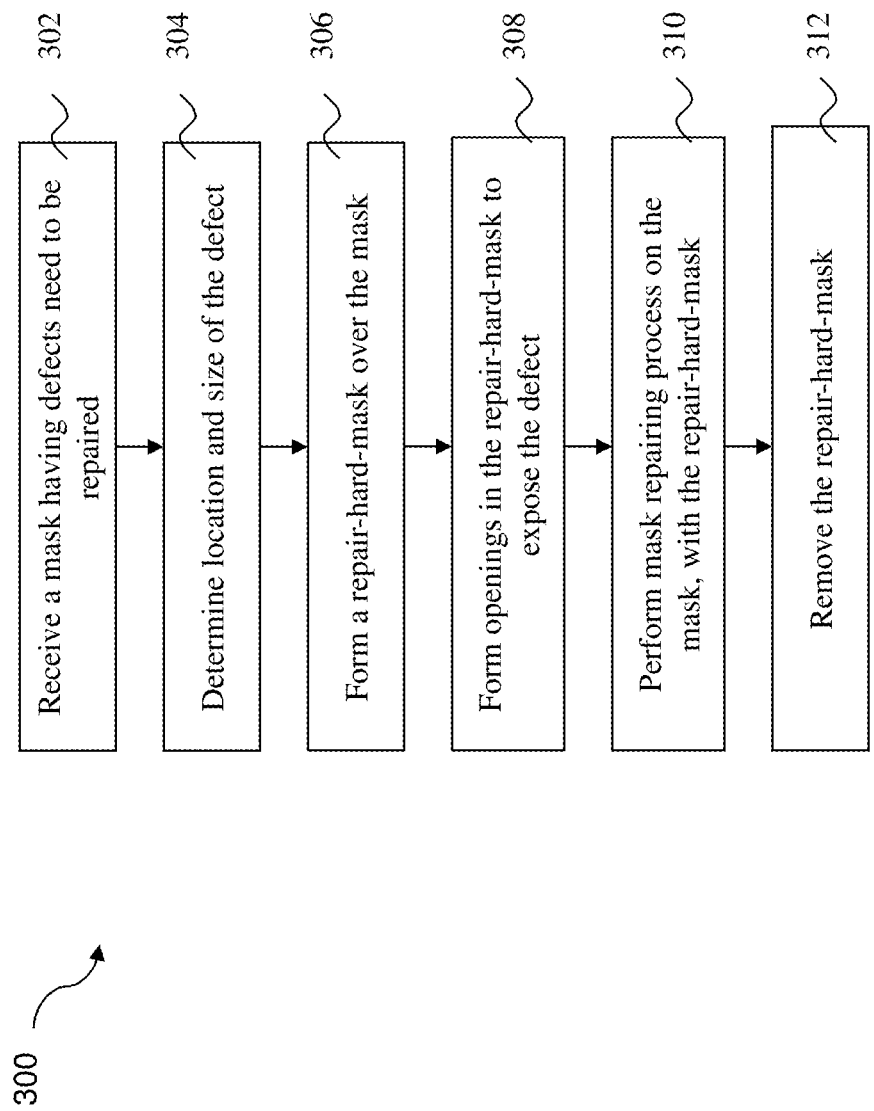
FIG. 4 is a flow chart of a method for repairing a mask according to various aspects of the present disclosure.

FIG. 4 is a flowchart of a method 300 of repairing a mask according to aspects of the present disclosure. FIGS. 5, 6A-6B, 7A-7B, 8A-8B and 9 are cross-sectional views of one embodiment of a mask 400 at various stages of the method 300.

Figure 5:
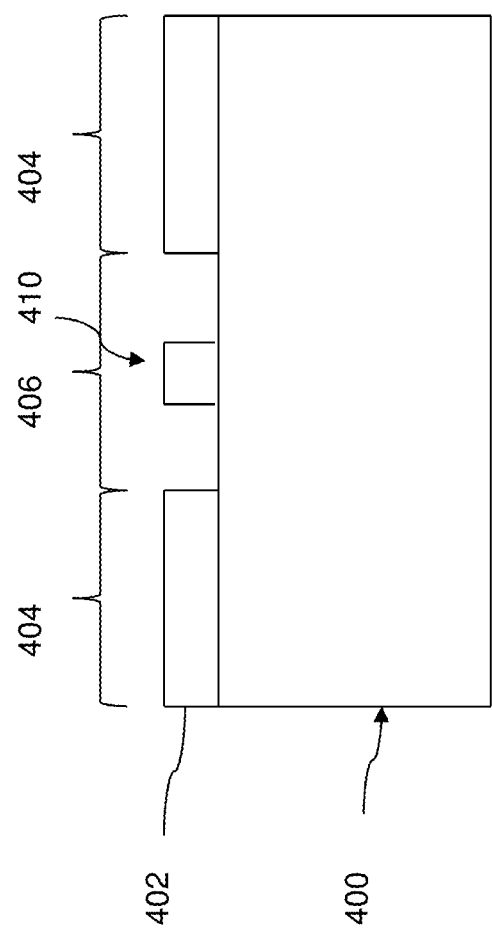
FIGS. 5, 6A to 6B, 7A to 7B, 8A to 8B and 9 are cross sectional views of one embodiment in various stages for repairing a mask according to various aspects of the present disclosure.

Referring to FIGS. 4 and 5, the method 300 starts at step 302 by receiving the mask 400 having at least one defect 410 needed to be repaired. The mask 400 has a patterned absorption layer 402 to define a first region 404 and a second region 406. The defect 410 locates in the second region 406. FIGS. 5A-5C have been simplified for the sake of clarity to better illustration of concepts of the present disclosure. The mask 400 includes transmissive and reflective masks. The defect 410 includes a residue of the absorption layer left in the second region 406 (a transmissive or a reflective region) of the mask 400. For another example, the defect 410 includes any undesired pattern features in the mask 400.

Referring to FIG. 4, the method 300 proceeds to step 304 by determining location and size of the defect 410. The location and size of the defect 410 may be detected by KLA-Tencor defect inspection, or other defect inspection tools.

Figure 6A:
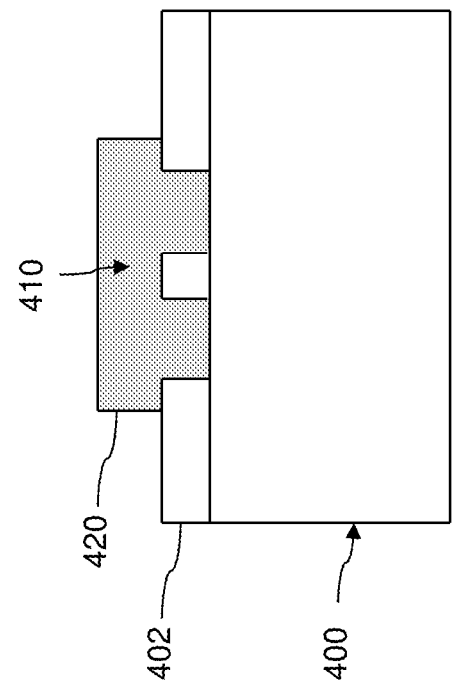
Figure 6B:
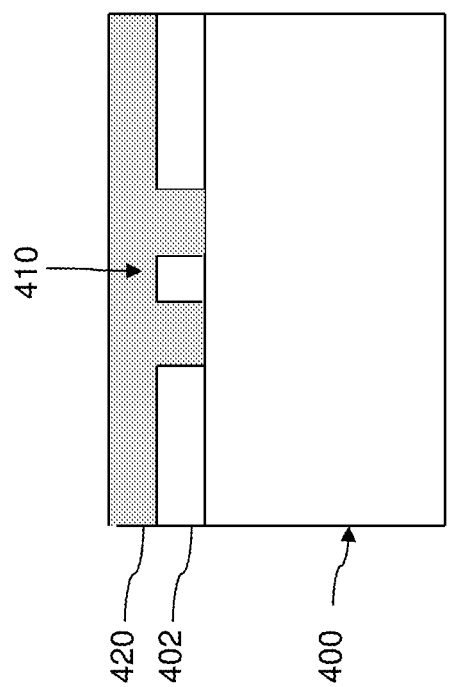

Referring to FIGS. 4 and 6A-6B, the method 300 proceeds to step 306 by forming a repair-hard-mask (RHM) 420 over the mask 400. A material of the RHM 420 is selected to reduce lateral reaction in a subsequent repairing process, such as reducing secondary electron distribution in an e-beam repairing process. The RHM 420 includes chromium (Cr), silicon oxide, silicon carbide, or any other suitable. In one embodiment, the RHM 420 is formed to cover entire mask 400, including the defect 410, referred to as a global RHM 420, as shown in FIG. 6A. The global RHM can be formed by processes such as CVD, PVD, spin-on coating, or other suitable techniques. In another embodiment, the RHM 420 is formed to cover the defect 410 and its near surrounding area, referred to as a local RHM 420, as shown in FIG. 6B. The local RHM 420 may be formed by gas-assisted focused-electron-beam-induced deposition, or other suitable techniques.

Figure 7A:
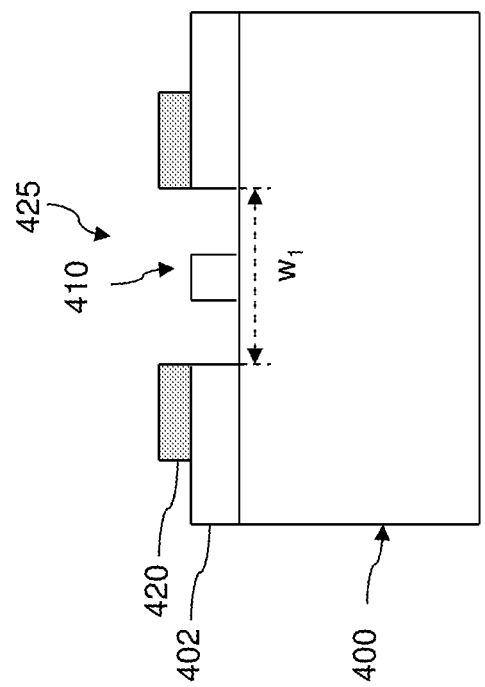
Figure 7B:
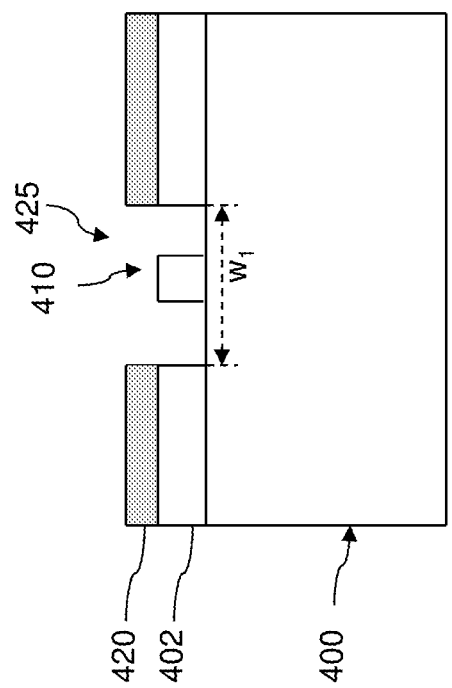

Referring to FIGS. 4 and 7A-7B, the method 300 proceeds to step 308 by forming an opening 425 in the global or local RHM 420 to expose the defect 410. The opening 425 may be formed by any suitable technique such as plasma etching, focused-ion-beam etching or focused-electron-beam-induced etching. As an example, the opening 425 in the Cr global RHM 420 is formed by an electron-beam-induced etching containing nitride oxide chlorine (NOCl) gas. A first width $w_1$ of the RHM 420 is targeted to achieve a proper repair region width.

Figure 8A:
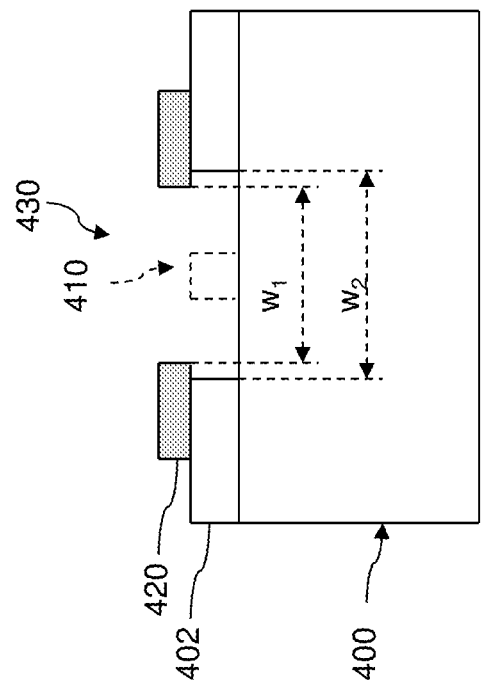
Figure 8B:
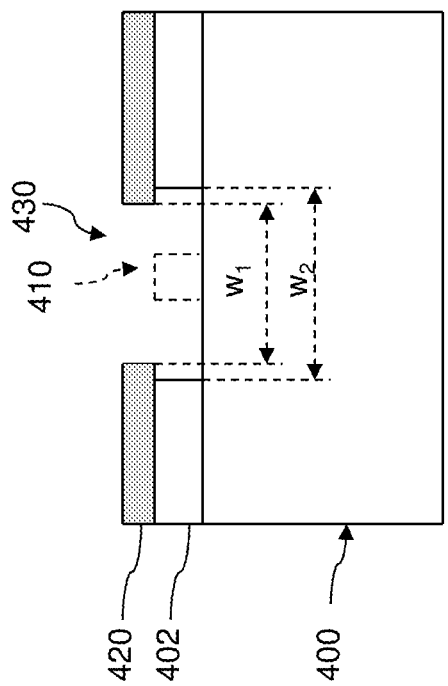

Referring to FIGS. 4 and 8A-8B, the method 300 proceeds to step 310 by performing defect repairing on the mask 400. In one embodiment, the repairing process is a local etching process to remove the defect 410 (shown in dash-line as in FIGS. 7A-7B). The repair process results in a repair region 430 with a second width $w_2$.

The repairing process may include focused-electron-beam-induced and focused-ion-beam etching. In a focused-electron-beam induced etching a suitable precursor gases are dispensed in very close vicinity to the incident electron beam and a reaction is induced by the focused electron beam, which results in etching. Meantime, a backscattered or secondary electrons may be generated and scatter back to react with the precursor gases in unwanted region near the defect 410 to make a repair region 430 have an undesired wider width. In the present embodiment, by using the RHM 420, a major portion of the backscattered or secondary electrons are blocked to scatter back and thus its reaction with the precursor gases is reduced dramatically. So the second width $w_2$ of the repair region 430 is much confined to the area exposed by the focused electron beam and it results in a high-resolution repairing process. By selecting a proper first width $w_1$ of RHM 420, a control of the second width $w_2$ of the repair region 430 can be further enhanced. For example, with the RHM 420 having 55 nm $w_1$ of the opening 425, a 75 nm $w_2$ of the repair region is achieved by an etch repairing process, instead of a 95 nm $w_2$ by the etch repairing process without the RHM 420.

Figure 9:
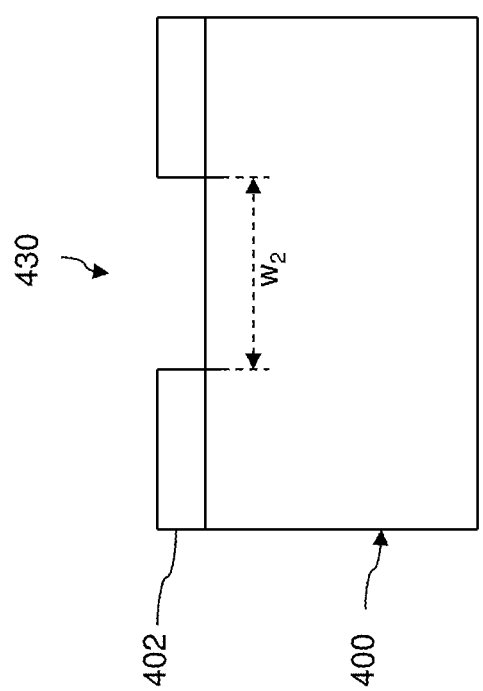

Referring to FIGS. 4 and 9, the method 300 proceeds to step 312 by striping the RHM 420. The RHM 420 may be removed by wet etch, dry etch, or any other suitable processes. For example, the Cr RHM 420 may be removed by a dry etch containing mixture gasses of chlorine and oxygen.

Additional steps can be provided before, during, and after the method 300, and some of the steps described can be replaced or eliminated for other embodiments of the method. Additionally, some steps may be performed concurrently with other steps.

Based on the above, it can be seen that the present disclosure offers the mask repair method. The method employs forming a repair hard mask over a to-be-repaired-mask. By using repair hard mask, a repair-region-width-broaden effect in mask repair process is reduced dramatically. The method provides a high-resolution repairing process.

The present disclosure provides a method for repairing a mask. The method includes receiving a mask. The mask has at least one defect need to be repaired. The method also includes determining location and size of the defect, forming a repair hard mask (RHM) over the mask, etching the RHM to form an opening to expose the defect and repairing the defect with the RHM over the mask.

In another embodiment, a method for repairing an extreme ultraviolet (EUV) mask includes receiving an EUV mask. The EUV mask has at least one defect need to be repaired. The method also includes determining location and size of the defect, forming a repair hard mask (RHM) over the EUV mask, etching the RHM to form an opening to expose the defect, repairing the defect by gas-assisted focused-electron-beam technique with the RHM over the EUV mask and stripping the RHM after repairing the defect.

In yet another embodiment, a method for repairing an extreme ultraviolet (EUV) mask includes receiving an EUV mask. The EUV mask has at least one defect need to be repaired. The method also includes determining location and size of the defect, forming the chromium (Cr) repair hard mask (RHM) over the EUV mask, etching the Cr RHM to form an opening to expose the defect, repairing the defect with the Cr RHM over the EUV mask, by gas-assisted focused-electron-beam etching technique and stripping the Cr RHM after repairing the defect.

The foregoing outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for repairing a mask, comprising:
   receiving a mask having a defect;
   determining location and size of the defect;
   forming a repair hard mask (RHM) over the mask;
   forming an opening in the RHM to expose the defect; and
   removing the defect through the opening in the RHM by performing an etching process selected from the group consisting of a focused-electron-beam induced etching process and a focused-ion-beam etching process.

2. The method of claim 1, wherein the RHM is formed locally over the defect by gas-assisted focused-electron-beam-induced deposition.

3. The method of claim 1, wherein the opening is formed by a first etching process.

4. The method of claim 1, wherein the RHM is formed globally to cover entire mask.

5. The method of claim 1, wherein the selected etching process is the focused-electron-beam-induced etching process.

6. The method of claim 1, wherein the RHM includes chromium (Cr).

7. The method of claim 1, further comprising:
   stripping the RHM after repairing the defect.

8. The method of claim 1, wherein the selected etching process is the focused-ion-beam etching process.

9. The method of claim 1, wherein the RHM includes silicon carbide.

10. The method of claim 1, wherein forming the opening in the RHM to expose the defect includes performing another etching process selected from the group consisting of another focused-electron-beam induced etching process and another focused-ion-beam etching process.

11. A method for repairing an extreme ultraviolet (EUV) mask, comprising:
   receiving an EUV mask having at least one defect, which is to be repaired;
   determining a location and a size of the defect;
   forming a repair hard mask (RHM) over the EUV mask;
   etching the RHM to form an opening to expose the defect;

removing the defect by a gas-assisted focused-electron-beam technique through the opening, with the RHM over the EUV mask; and stripping the RHM after repairing the defect.

12. The method of claim 11, wherein the RHM is formed locally over the defect by a gas-assisted focused-electron-beam-induced deposition.

13. The method of claim 11, wherein the RHM is formed globally to cover the entire mask.

14. The method of claim 11, wherein the RHM is formed by depositing a chromium (Cr) layer over the mask.

15. The method of claim 11, wherein the etching the RHM to form the opening to expose the defect includes performing a focused-ion-beam etching process.

16. The method of claim 11, wherein the etching the RHM to form the opening to expose the defect includes performing another gas-assisted focused-electron-beam etching technique.

17. The method of claim 11, stripping the RHM after repairing the defect includes performing a wet etching process.

18. A method for repairing an extreme ultraviolet (EUV) mask, comprising:

receiving an EUV mask having at least one defect, which is to be repaired;

determining a location and a size of the defect;

forming a chromium (Cr) repair hard mask (RHM) over the EUV mask;

etching the Cr RHM to form an opening to expose the defect;

removing the defect by a gas-assisted focused-electron-beam etching technique through the opening, with the Cr RHM over the EUV mask; and removing the Cr RHM after repairing the defect.

19. The method of claim 18 wherein etching the Cr RHM to form the opening to expose the defect includes performing a focused-ion-beam etching process.

20. The method of claim 18 wherein etching the Cr RHM to form the opening to expose the defect includes performing another gas-assisted focused-electron-beam etching technique.

* * * * *